United States Patent [19]
Sauer

[11] Patent Number: 5,959,498
[45] Date of Patent: Sep. 28, 1999

[54] CHOPPER-STABILIZED OPERATIONAL AMPLIFIER INCLUDING LOW-NOISE CHOPPER SWITCH

[75] Inventor: Don Roy Sauer, San Jose, Calif.

[73] Assignee: National Semiconductor Corporation, Santa Clara, Calif.

[21] Appl. No.: 08/811,063

[22] Filed: Mar. 3, 1997

[51] Int. Cl.⁶ .................................................... H03F 1/02
[52] U.S. Cl. .............................................. 330/9; 327/124
[58] Field of Search ............................... 330/9, 51, 277; 327/124

[56] References Cited

U.S. PATENT DOCUMENTS

| | | | |
|---|---|---|---|
| 4,947,135 | 8/1990 | Mijuskovic | 330/9 |
| 5,115,202 | 5/1992 | Brown | 330/9 |
| 5,600,283 | 2/1997 | Sauer | 331/111 |

FOREIGN PATENT DOCUMENTS 1181221  7/1989  Japan .................................... 327/124

OTHER PUBLICATIONS

Jones, Don and Webb, Robert W., "Chopper–Stabilized Op Amp Combines MOS and Bipolar Elements on One Chip", Electronics, Sep. 27, 1973, pp. 110–114.

Frederiksen, Thomas M., *Intuitive IC OP AMPS*, National Semiconductor Technology Series, 1984, Santa Clara, CA, pp. 8–12.

Horowitz, Paul and Hill, Winfield, *The Art of Electronics*, Cambridge University Press, 1980, New York, pp. 80–86, 286–307.

Smith, Ralph J., *Electronics: Circuits and Devices*, John Wiley and Sons, 1980, New York, pp. 434–457.

*Primary Examiner*—Steven Mottola
*Attorney, Agent, or Firm*—Skjerven, Morrill, MacPherson, Franklin & Friel LLP; David E. Steuber

[57] ABSTRACT

To minimize noise generation a chopper switch for a chopper stabilized operational amplifier includes a balanced bridge circuit with two pairs of high-side and low-side transistors connected in parallel. The transistors are not turned completely off but operate in the manner of variable resistors between a high-resistance level and a low-resistance level. One or more additional transistors are include to provide a parasitic capacitance in the break-before-make interval when all of the other transistors are turned off. To provide rail-to-rail operation, complementary circuits contain N-channel and P-channel transistors are connected in parallel between the input and output terminals of the chopper switch.

20 Claims, 9 Drawing Sheets

KEY TO FIG. 8

| FIG. 8B |
|---|
| FIG. 8A |

CHOPPER-STABILIZED OPERATIONAL AMPLIFIER INCLUDING LOW-NOISE CHOPPER SWITCH

CROSS REFERENCE TO RELATED APPLICATION

This application is related to commonly invented and owned application Ser. No. 08/810,095, entitled "Chopper-Stabilized Operational Amplifier Including Integrated Circuit With True Random Voltage Output," filed herewith, which is incorporated herein by reference in its entirety.

BACKGROUND OF THE INVENTION

It is known to use a device called a "chopper" to stabilize an operational amplifier. A DC (or low frequency) voltage at the input terminals of the op amp is "chopped" to convert it to an square-wave AC signal which can be amplified more easily and more precisely than a DC voltage. After the chopped AC signal has been amplified, it is directed to the trim port of the main (pass) amplifier where it is used to reduce drift and correct the offset voltage at the input of the op amp. A more complete discussion of chopper-stabilized op amps is contained in T. M. Frederickson, Intuitive IC Op Amps, National Semiconductor Corporation, 1984, pp. 8–12.

One problem with conventional choppers is that the switch used to convert the DC input to an AC signal generates noise that is then fed back to the input terminals of the op amp.

SUMMARY OF THE INVENTION

The noise problem is greatly reduced using the input chopper switch of this invention, which comprises a bridge arrangement including a first high-side transistor connected in series with a first low-side transistor between the input terminals of the chopper switch and a second high-side transistor connected in series with a second low-side transistor between the input terminals of the chopper switch. A first control input terminal is coupled to the respective control terminals of said first high-side transistor and said second low-side transistor, and a second control input terminal is coupled to the respective control terminals of said second high-side transistor and said second low-side transistor. The chopper switch also includes a control circuit which comprises a source of a first bias voltage which is sufficient to turn the transistors fully on, a source of a second bias voltage sufficient to turn the transistors partially on, and a timing circuit for delivering the first and second bias voltages in sequence to the first and said control inputs. First and second output terminals are coupled to common nodes between the high-side and low-side transistors, respectively.

The bridge circuit is balanced such that one of the transistor in each series path is turned off when the other transistor is turned on. This balancing reduces the noise generated by the chopper switch. The transistors are preferably of a variety which has low stray capacitances between its source and drain terminals and its gate terminal.

To prevent a short circuit, it is necessary to turn off one of the transistors in each series pair shortly before turning on the other transistor in the pair. To prevent noise from being generated in this "break-before-make" interval, variable capacitive elements are connected into the switch, the variable capacitive elements being activated by the control circuit in the break-before-make interval. In the preferred embodiment, the capacitive elements comprise field effect transistors having their source and drain terminals connected to the respective input terminals of the switch and their gate terminals connected to the control circuit.

Since the two bias voltages supplied by the control circuit to the control terminals of the high-side and low-side transistors do not turn any of these transistors completely off, the transistors function in the manner of variable resistors rather than switches. This greatly reduces the noise generated by the chopper switch.

DESCRIPTION OF THE INVENTION

Figure 1:
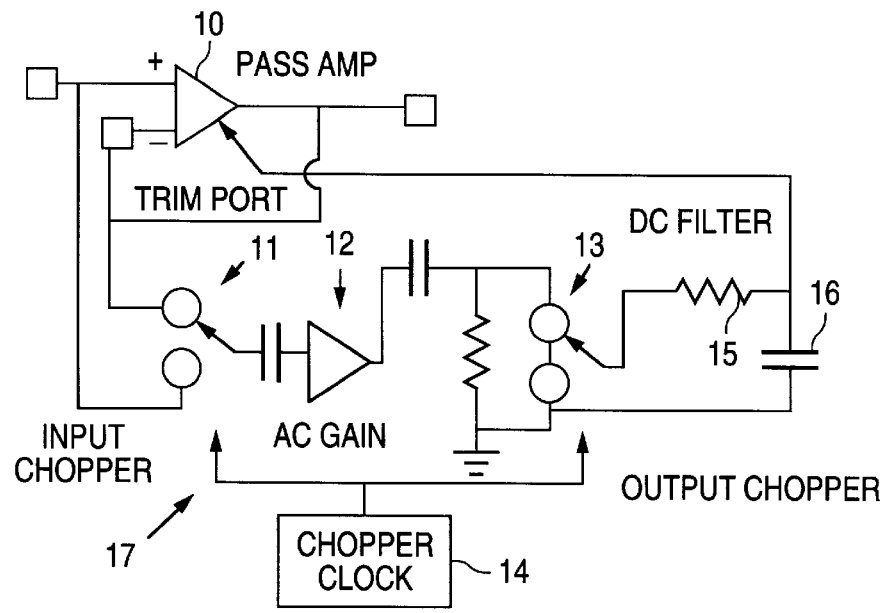
FIG. 1 illustrates a block circuit diagram of a chopper-stabilized operational amplifier which contains an input chopper switch in accordance with this invention.

A block diagram of a conventional chopper-stabilized operational amplifier is shown in FIG. 1. A pass amplifier 10 includes inverting (−) and non-inverting (+) input terminals, an output terminal, and a trim port. The input terminals are connected to the trim port in a feedback path which includes a chopper 17. Chopper 17 receives a signal present at the input terminals of pass amplifier 10, converts the signal to an AC signal which is amplified in an AC gain stage 12, and delivers a signal to the trim port of pass amplifier 10. The signal at the input terminals of pass amplifier 10 is converted to an AC signal by means of an input chopper switch 11. After the chopped AC signal has been amplified, it is converted back to a DC signal by means of an output chopper switch 13 and filter including a resistor 15 and a capacitor 16. Input chopper switch 11 and output chopper switch 13 are driven synchronously by a clock 14 which preferably includes a random frequency generator of the kind described in co-pending application Ser. No. 08/810, 095, which is incorporated herein by reference in its entirety.

Figure 2:
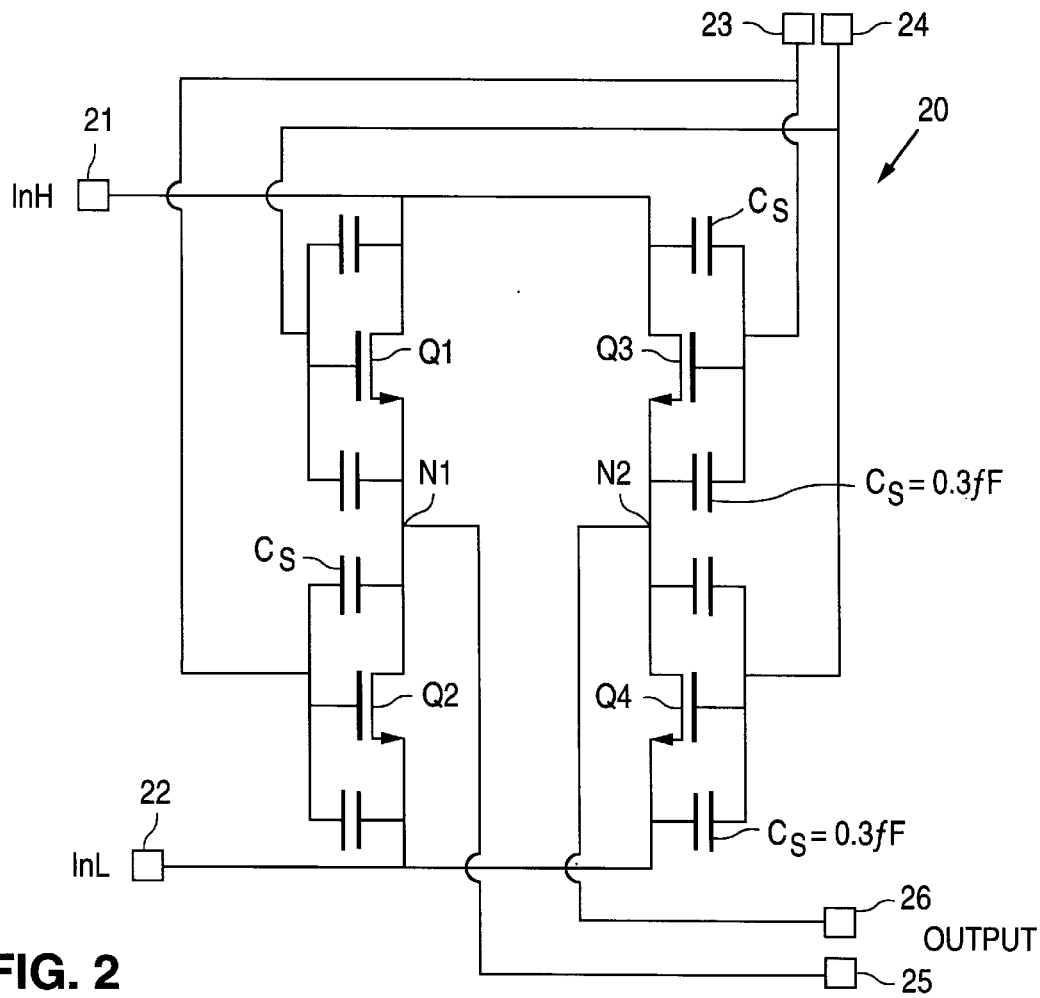
FIG. 2 illustrates a circuit diagram of the bridge circuit employed in the chopper switch of this invention.

Input chopper switch 11 includes a bridge circuit 20 as shown in FIG. 2. Transistors Q1 and Q2 are connected in a series path between the input terminals 21 and 22. Similarly, transistors Q3 and Q4 are connected in a second series path between the input terminals 21 and 22. As is evident from FIG. 1 input terminals 21 and 22 are connected to the inverting and non-inverting input terminals of pass amplifier 10. The signal delivered at input terminals 21 and 22 are designated InH and InL in FIG. 2. A first control terminal 23 supplies a bias voltage to the gates of transistors Q2 and Q3, and a second control terminal 24 supplies a bias voltage to the gates of transistors Q1 and Q4. A first output terminal 25 is connected to a common node N1 between transistors and Q1 and Q2, and a second output terminal 26 is connected to a common node N2 between transistors Q3 and Q4.

As will be explained below, input terminals 23 and 24 receive bias signals which alternate between a first bias voltage which is sufficient to turn transistors Q1–Q4 fully on and a second bias voltage which is sufficient to turn transistors Q1–Q4 only partially on. The second bias voltage is preferably near the threshold voltage Vth of transistors Q1–Q4. For example, when the bias voltage applied at terminal 23 turns transistors Q2 and Q3 fully on, the voltage applied at terminal 24 is approximately one threshold voltage drop above the voltage at terminal 22. Thus transistors Q1 and Q4 are turned partially on, to the point where their channels are just beginning to conduct current.

Capacitors Cs in FIG. 2 represent the stray capacitances between the gate and source and the gate and drain of transistors Q1–Q4. Preferably transistors Q1–Q4 are chosen to have minimal stray capacitance. Such transistors typically have self-aligned gates which provide minimal overlap of the source and drain diffusions in the transistor.

The remaining stray capacitances in bridge circuit 20 are balanced in the sense that every increase in voltage is balanced by an equal and opposite decrease in voltage. The stray capacitances now appear mainly as mismatches in the balance, i.e., a "perfect" balance is unattainable.

Figure 3A:
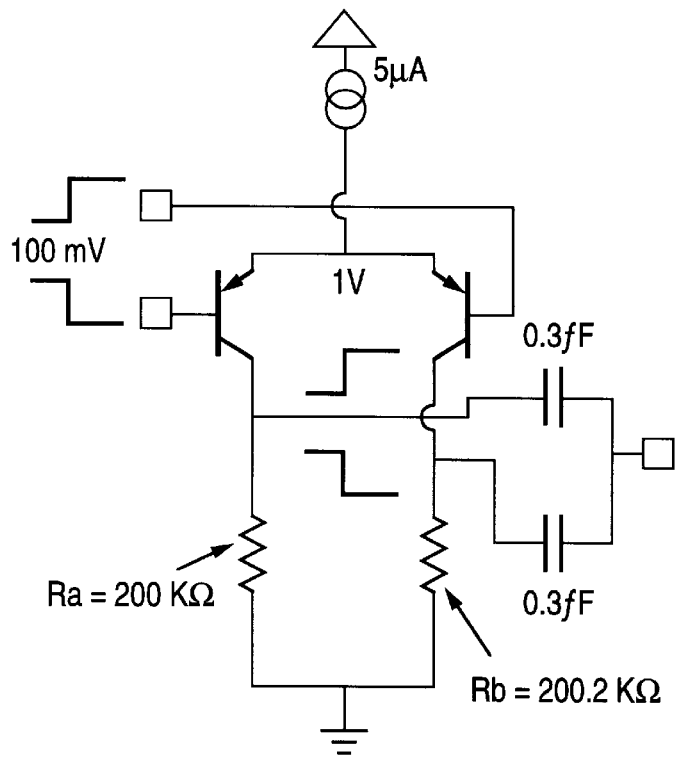
FIGS. 3A, 3B and 3C illustrate equivalent circuits of the bridge circuit assuming an imbalance in the circuit.
Figure 3B:
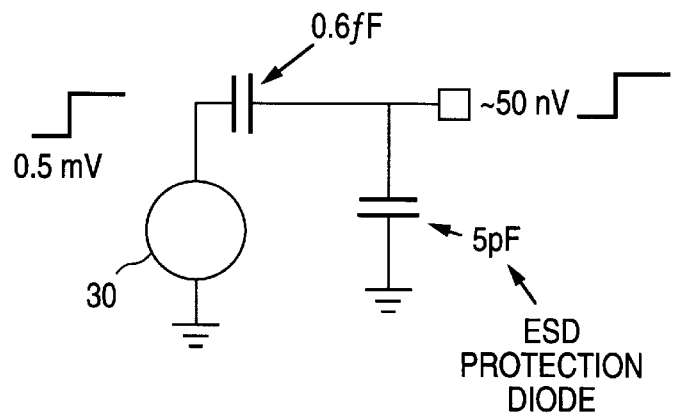
Figure 3C:
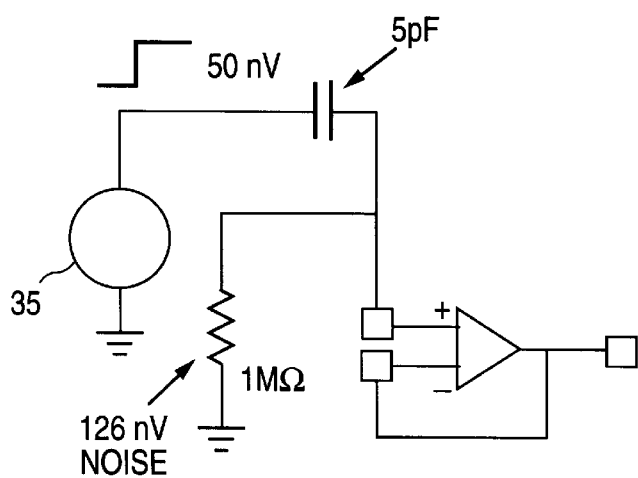

FIGS. 3A, 3B and 3C illustrate the effects of a 0.1% mismatch in the control signal to bridge 20. This error is represented in FIG. 3A as a 0.1% mismatch in the size of resistors Ra and Rb. The two capacitors shown represent the 0.3 fF capacitors Cs of FIG. 2. As shown in FIG. 3B, with a tail current of 5 $\mu$A, the 0.2 K$\Omega$ difference between resistors Ra and Rb can be modeled as a voltage source 30 supplying a 0.5 mV AC square wave coupled through a stray capacitance of 0.6 fF and a 5 pF capacitor that represents the capacitance of the diode typically used to provide ESD protection at the inputs of the amplifier. The 0.6 fF and 5 pF capacitors act as a voltage divider, producing a 50 nV AC square wave at the output of the equivalent circuit of FIG. 3B. This 50 nV AC square wave is modeled as a voltage source 35 in FIG. 3C. The possible measure of quality is whether a 1M$\Omega$ resistor can be connected to the input of the chopper and still have the overall noise dominated by the thermal noise of the 1 M$\Omega$ resistor. If a 1 M$\Omega$ resistor is connected to an input of the amplifier, its noise per root hertz will be 126 nV. This is more than double the 50 nV AC square wave generated by the 0.1% mismatch in the control signal to the bridge.

Figure 4:
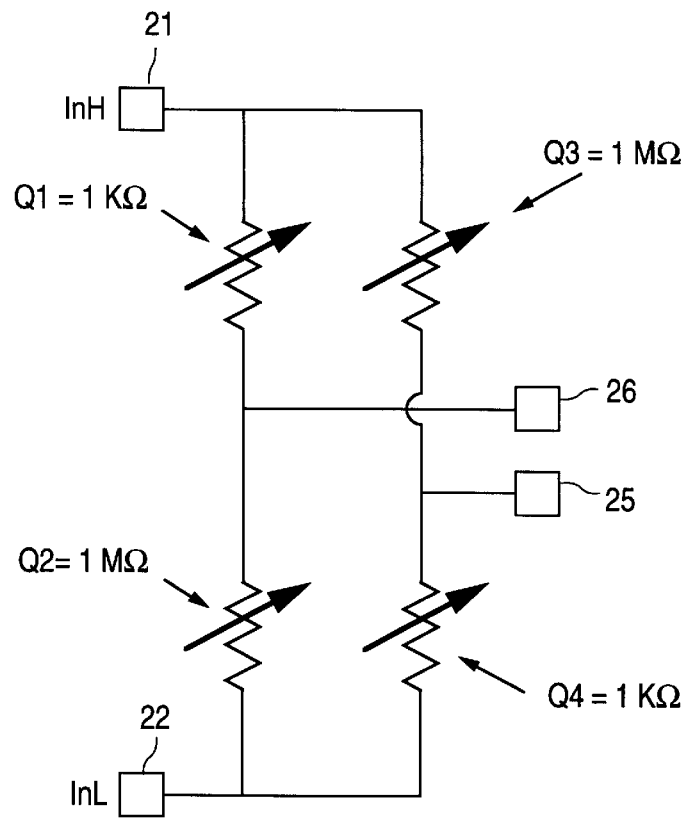
FIG. 4 illustrates an equivalent circuit of the bridge circuit showing the transistors as variable resistors.

Referring again to FIG. 2, transistors Q1–Q4 remain in the inversion state as they are "switched" by the signals from control terminals 23 and 24. They do not enter the depletion or accumulation state, which would lead to the generation of significant noise. Thus transistors Q1–Q4 can be modeled as variable resistors, as shown in FIG. 4. In this embodiment transistors Q1–Q4 vary between 1 K$\Omega$ and 1 M$\Omega$ as the voltage applied to their gates via terminals 23 and 24 goes high and low. Assuming that the offset voltage across the input terminals of pass amplifier 10 is about 1 $\mu$V, having one of the transistors in each series pair at 1 M$\Omega$ means that the current through the transistor pairs is about 1 pA. It is desirable to keep this current low.

Figure 6:
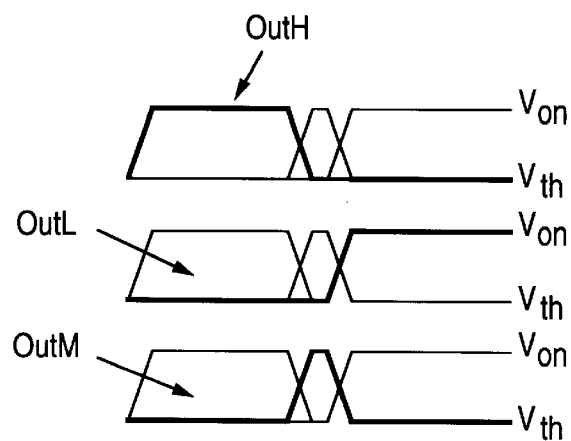
FIG. 6 illustrates a graph showing the waveforms at the control inputs of the bridge circuit.

To insure that a short circuit is not created between terminals 21 and 22, a break-before-make drive signal is used for transistors Q1–Q4. A representation of the waveforms applied to control terminals 23 and 24, designated OutH and OutL is shown in FIG. 6. As is evident, both OutH and OutL are low in the break-before-make interval. This could lead to noise problems, and it is therefore advantageous to provide a third control voltage to the bridge so as to conserve the balancing effects on the stray capacitances.

Figure 5:
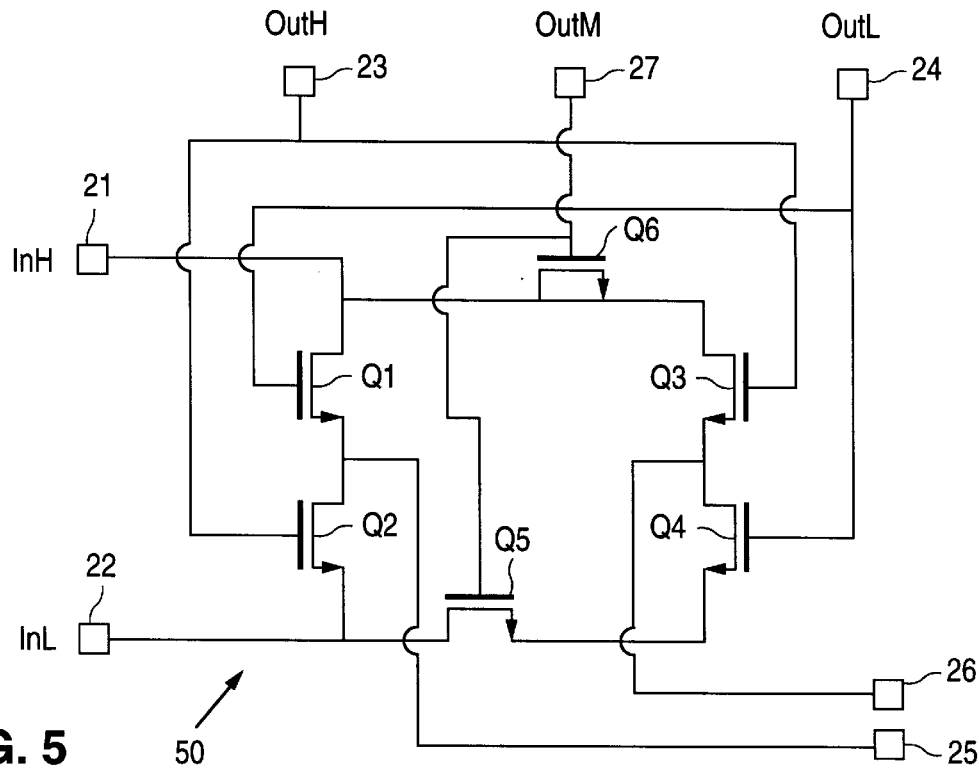
FIG. 5 illustrates a circuit diagram of a bridge circuit used in the chopper switch.

Chopper switch 50 shown in FIG. 5 includes a modified bridge circuit. A third control terminal 27 is coupled to the gates of transistors Q5 and Q6. The source and drain terminal of transistors Q5 and Q6 are tied to input terminals 21 and 22. The signal applied at control terminal 27, designated OutM, is illustrated in FIG. 6. OutM goes high in the break-before-make interval and provides a gate capacitance in transistors Q5 and Q6, which function as a transitional capacitance element capable of absorbing charge carriers when each of transistors Q1–Q4 is in its high impedance state.

FIGS. 7, 8A, 8B and 9 are block diagrams of circuitry for producing the bias voltages shown in FIG. 6. There are alternative circuits for achieving this purpose, however, and thus the circuitry shown in FIGS. 7, 8A, 8B and 9 should not be interpreted as limiting.

Figure 7:
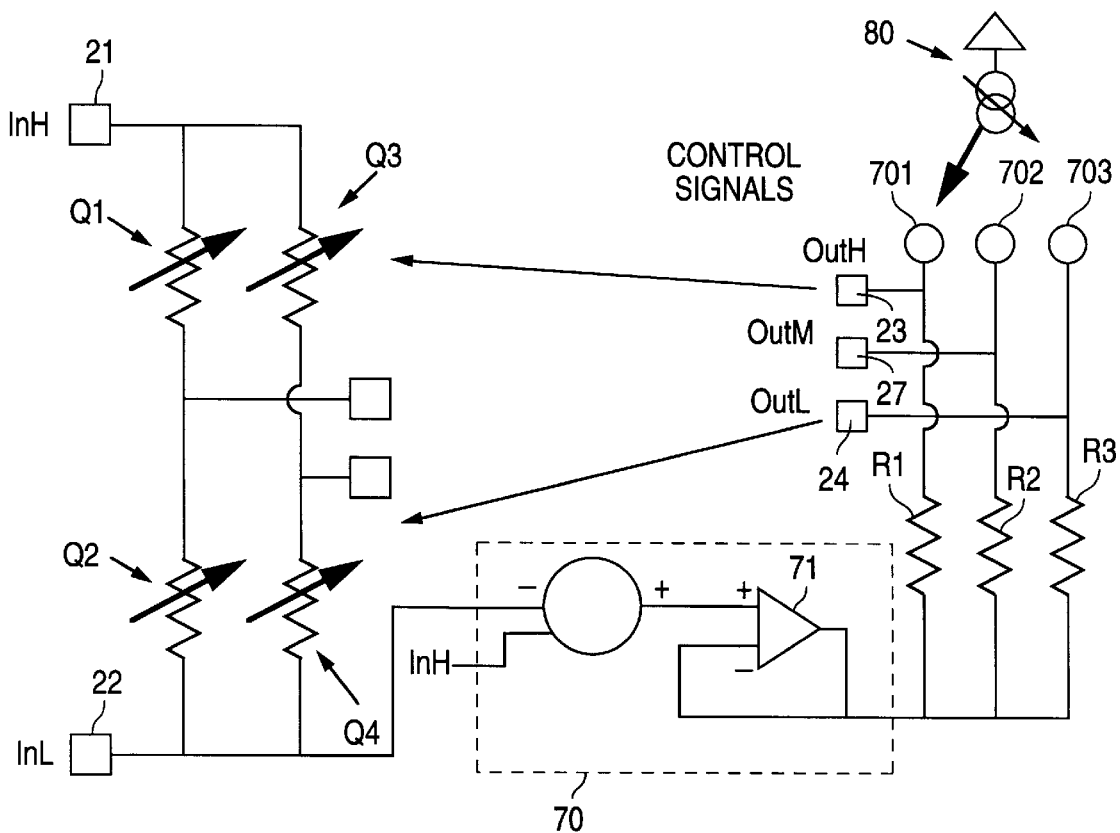
FIG. 7 illustrates a block diagram of a portion of the chopper switch.

FIG. 7 is an overall block diagram showing a threshold voltage circuit 70 and a control circuit 80. Threshold voltage unit 70 receives the input signals InH and InL and delivers an output to a common junction of equal output resistors R1, R2 and R3. Control circuit 80 applies a high voltage sequentially to nodes 701, 702 and 703 on the opposite sides of resistors R1, R2 and R3 to provide the control signals at terminals 23, 24 and 27.

Figure 8A:
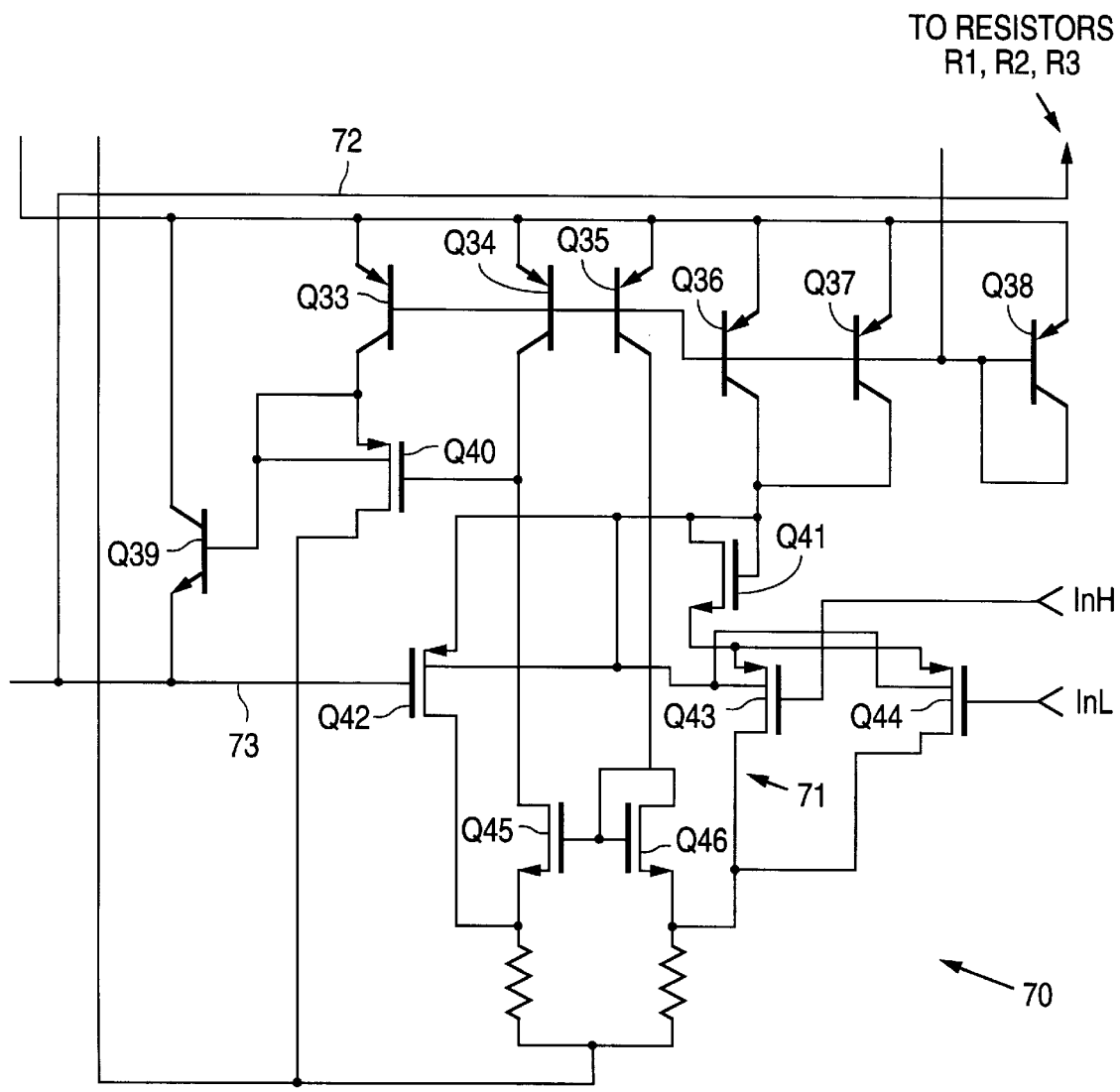
FIGS. 8A and 8B illustrate a circuit diagram of the threshold voltage circuit and a portion of the control circuit.
Figure 8B:
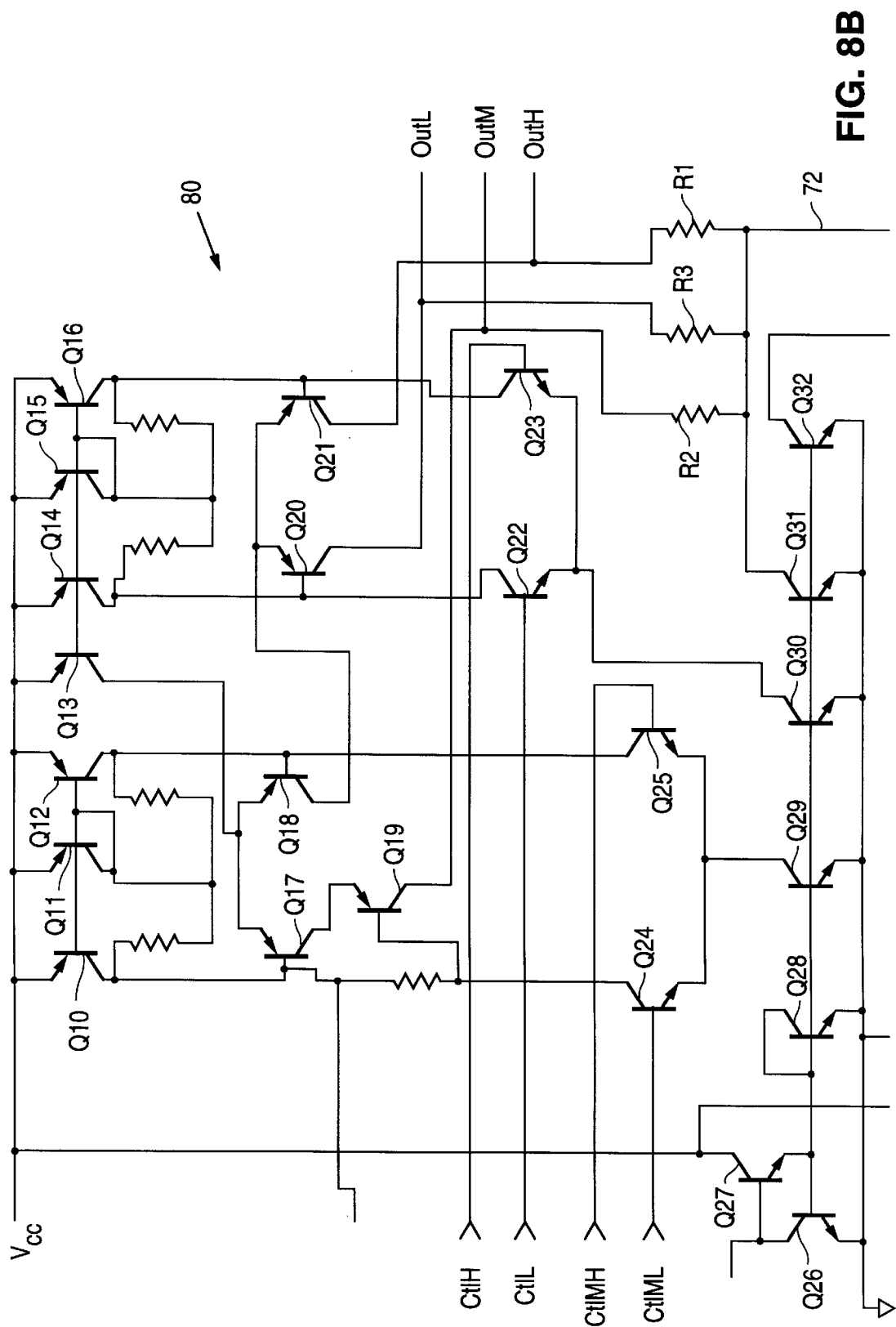

FIG. 8A illustrates a circuit diagram of threshold voltage circuit 70. The input signals InH and InL are delivered to the gates of transistors Q43 and Q44 which along with transistor Q42 are part of the differential stage of an operational amplifier 71. Transistors Q43 and Q44 are connected in parallel and in effect provide an average of InH and InL to the differential amplifier. Transistors Q45 and Q46 form a current mirror. Operational amplifier 71 also includes a transistor Q41 which has its gate shorted to its drain and therefore functions as a diode. The output of the current mirror is provided at the drain of transistor Q45 which is delivered to the gate of transistor Q40. Transistors Q39 and Q40 are part of an intermediate or gain stage. A feedback path 71 leads from the emitter of transistor 39, which is the output of the operational amplifier, to the gate of transistor Q42, which is the inverting input of the operational amplifier. Therefore, because of the imbalance provided by transistor Q41, the voltage at the emitter of transistor Q39 (gate of transistor Q42) is approximately one threshold voltage drop above InH and InL. This voltage is delivered over line 72 to a common terminal of resistors R1, R2 and R3 (FIG. 8B). Transistors Q33–Q38 are transistors of equal size which act as current sources for the other transistors in the circuit.

Figure 9:
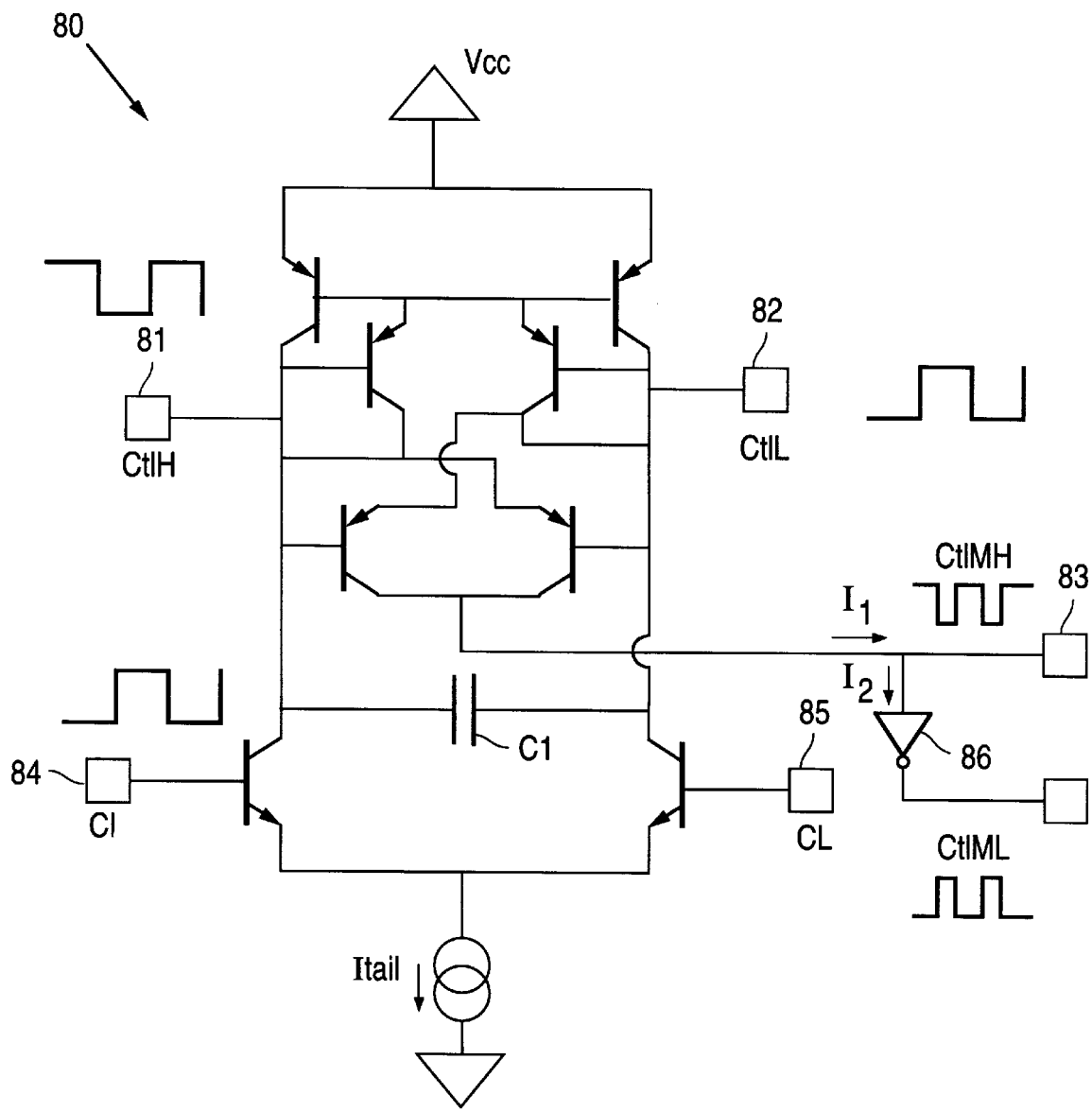
FIG. 9 illustrates a circuit diagram of the remainder of the control circuit.

FIGS. 8B and 9 illustrate a circuit diagram of control circuit 80. Referring first to FIG. 9, there is shown a data transition blanking circuit which uses the DC isolation logic technique. The circuit is modified by the addition of a capacitor C1. Without capacitor C1 this circuit operates as a bipolar version of an absolute value current difference detector (or exclusive OR gate). The current at output 83 equals the absolute value of the difference between the currents I1 and I2. A differential clock signal (Cl, CL) from clock 14 (FIG. 1) is input at terminals 84 and 85. When capacitor C1 is added, the absolute value function works only when the input signal is not in a state of transition. When the inputs change, the voltage drop across capacitor C1 is delayed by the period of time that it takes the tail current Itail to "slew" the capacitor. When the voltage across capacitor C1 reaches a steady state, the output current begins to flow again. Thus the current at terminal 83 is a blanking pulse CtlMH that is centered on the transitions of delayed output pulses (CtlH, CtlL) which appear at terminals 81 and 82. The blanking pulse CtlMH is passed through an inverter 86 to generate an inverse blanking pulse CtlML. Inverter 86 may be fabricated in the form of a differential amplifier.

Figure 10:
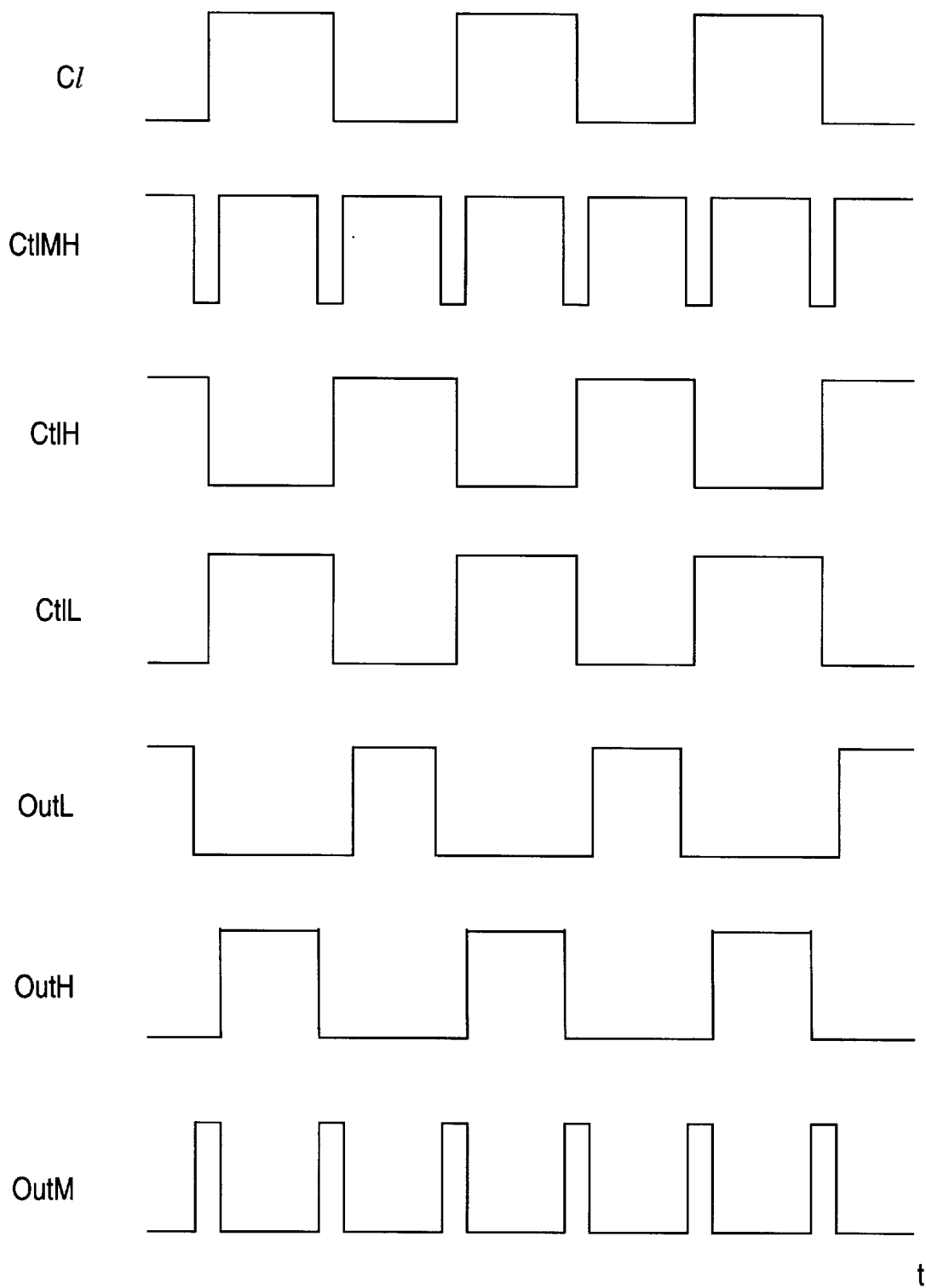
FIG. 10 illustrates a graph showing waveforms produced in the control circuit.

FIG. 10 illustrates the waveforms that appear at terminals 81, 82 and 83.

The blanking pulses (CtlMH, CtlML) and the two delayed outputs (CtlH, CtlL) from the circuitry shown in FIG. 9 are delivered to the remainder of control circuit 80, which includes the tri-state switch shown in FIG. 8B. The delayed output CtlH goes to the base of a transistor Q23. When CtlH is high transistor Q23 is turned on, and the collector of transistor Q23 pulls down the base of transistor Q21. Transistor Q21 is therefore turned on. Similarly, when CtlH is high transistor Q22 is turned on, and the collector of transistor Q22 pulls down the base of transistor Q20. Transistor Q20 is therefore turned on. A current through transistor Q21 passes through resistor R1, generating the control signal OutH. A current through transistor Q20 passes through resistor R3, generating the control signal OutL. A current can flow through either of transistors Q20 and Q21, however, only if transistor Q18 is turned on, and transistor Q18 is controlled by the blanking pulse CtlMH, which is applied to the base of transistor Q25. When CtlMH is high, transistor Q25 is on, and the collector of transistor Q25 pulls the base of transistor Q18 low, turning transistor Q18 on.

Transistors Q10–Q12 provide level shifting for the control voltages for transistors Q17 and Q18 and transistors Q14–Q16 provide level shifting for transistors the control voltages for transistors Q20 and Q21. Transistor Q13 sources the tail current for transistors Q17 and Q18.

Conversely, when the inverse blanking pulse CtlML is high, transistor Q24 is turned on, and this turns on transistors Q17 and Q19. A current then flows through resistor R2, and the control signal OutM is generated.

The waveforms of OutH, OutL, and OutM are shown in FIG. 10. In particular, the midpoint of OutM occurs at the midpoint between the transitions when OutH and OutL are switch between their high and low states.

Referring again to FIG. 5, it is seen that OutH is applied to the gates of transistors Q2 and Q3, OutL is applied to the gates of transistors Q1 and Q4, and OutM is applied to the gates of transistors Q5 and Q6. Thus, transistors Q2 and Q3 turn on and off simultaneously, transistors Q1 and Q4 turn on and off simultaneously, and transistors Q5 and Q6 turn on in the break-before-make interval when transistors Q1–Q4 are turned off. The control signals OutH, OutL and OutM vary between a lower level that is barely adequate to turn transistors Q1–Q6 and a higher level that is adequate to turn transistors Q1–Q6 completely on.

Figure 11:
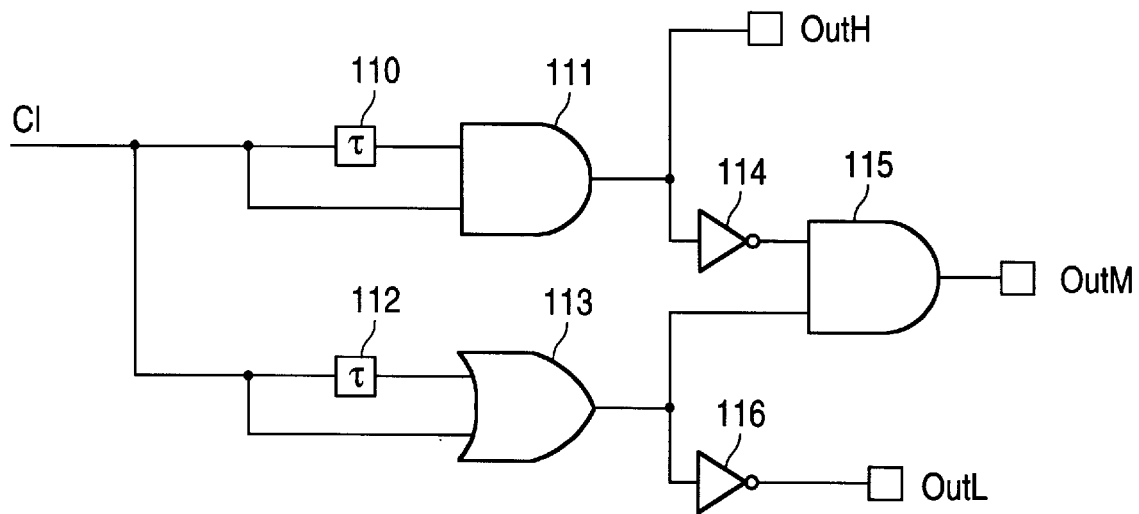
FIG. 11 illustrates an alternative digital technique of generating the control signals.

The circuitry shown in FIGS. 8A, 8B and 9 is only illustrative of a technique of generating the control signals OutH, OutL and OutM. Numerous alternative techniques may be used. FIG. 11 shows a digital circuit, including AND gates 111 and 115 and an OR gate 113, that may be used to generate the control signals. the clock signal C1 is passed through delay lines 110 and 112 to one of the inputs of AND gate 110 and OR gate 113, respectively. C1 is delivered directly to the other inputs of AND gate 110 and OR gate 113. The control signal OutH is taken at the output of AND gate 111, and the control signal OutL is taken as an inverted output of OR gate 113. The control signal OutM is taken at the output of AND gate 115.

Figure 12:
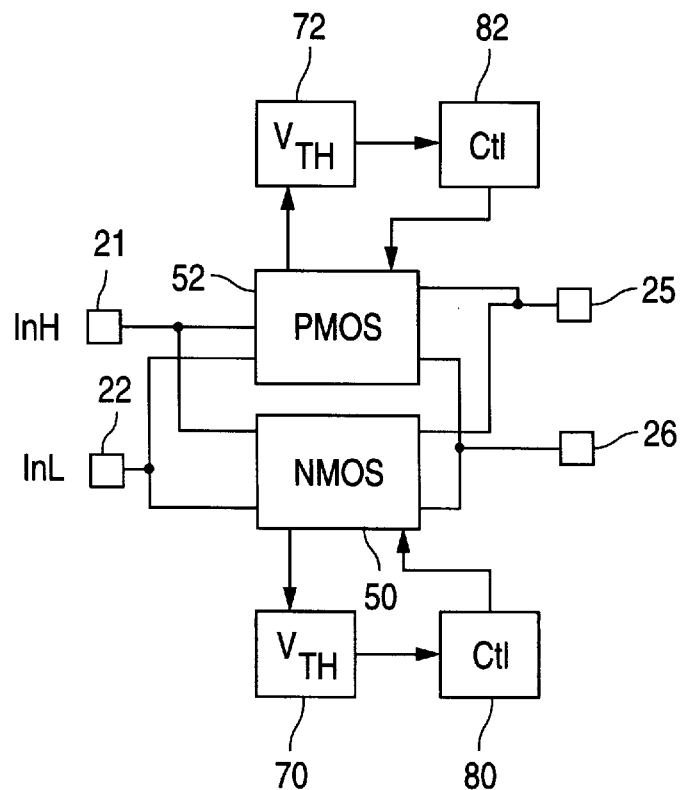
FIG. 12 illustrates a block diagram of the entire chopper switch.

The bridge circuit 50 shown in FIG. 5 includes N-channel MOSFETs. To provide rail-to-rail operation, it is preferable to include a second P-channel bridge circuit in parallel with bridge circuit 50, as shown in FIG. 12. Bridge circuit 52 includes P-channel MOSFETs but is otherwise similar to bridge circuit 50. Bridge circuit 50 is connected to a voltage threshold circuit 72 that is similar to threshold voltage circuit 52 but supplies a voltage that is approximately one threshold voltage drop below InH and InL. Control circuit 82 is similar to control circuit 80 but supplies control signals that turn the P-channel MOSFETs in bridge circuit 52 either partially or fully on in a manner similar to the operation of the N-channel MOSFETs in bridge circuit 50. If desired, a single circuit of the type shown in FIG. 9 may be used to generate the control signals CtlH, CtlL, CtlMH and CtlML for both the N-channel and P-channel circuitry.

The foregoing description is intended to be illustrative only. Numerous alternative embodiments in accordance with the principles of this invention will be apparent to those skilled in the art, and the following claims are intended to include all such alternative embodiments.

I claim:

1. A chopper-stabilized operational amplifier comprising:
    a pass amplifier comprising an inverting input, a non-inverting input and a trim port; and
    a chopper comprising an input chopper switch, an AC gain stage, an output chopper switch, and a clock, said AC gain stage for receiving an output from said input chopper switch and delivering an output to said output chopper switch, said clock for driving said input and output chopper switches, an output of said chopper being coupled to said trim port, said input chopper switch comprising:
        a first input terminal and a second input terminal coupled to said inverting and non-inverting inputs, respectively;
        a bridge arrangement comprising a first high-side transistor connected in series with a first low-side transistor between said first and second input terminals and a second high-side transistor connected in series with a second low-side transistor between said first and second input terminals;
        a first control input terminal coupled to respective control terminals of said first high-side transistor and said second low-side transistor;
        a second control input terminal coupled to respective control terminals of said second high-side transistor and said second low-side transistor;
        a control circuit comprising a source of a first bias voltage sufficient to turn said transistors fully on and a source of a second bias voltage sufficient to turn said transistors partially on and switch circuitry for delivering said first and second bias voltages in sequence to said first and said control inputs; and
        first and second output terminals coupled to common nodes between said high-side and low-side transistors, respectively.

2. The chopper-stabilized operational amplifier of claim 1 wherein said input chopper switch further comprises a transitional capacitance element capable of absorbing charge carriers.

3. The chopper-stabilized operational amplifier of claim 2 wherein said transitional capacitance element comprises a fifth transistor connected to said first input terminal and a sixth transistor connected to said second input terminal.

4. The chopper-stabilized operational amplifier of claim 3 wherein said control circuit is for supplying a first control signal to said first control input terminal and a second control signal to said second input control terminal.

5. The chopper-stabilized operational amplifier of claim 3 wherein said input chopper switch further comprises a third control input terminal coupled to said fifth and sixth transistors.

6. The chopper-stabilized operational amplifier of claim 5 wherein said control circuit is for supplying a first control signal to said first control input terminal, a second control signal to said second input control terminal, and a third control signal to said third input control terminal.

7. The chopper-stabilized operational amplifier of claim 6 wherein said first control input signal functions to turn said first high-side and said second low-side transistors simultaneously fully on and then partially on and said second control signal functions to turn said first low-side and said second high-side transistors simultaneously fully on and then partially on.

8. The chopper-stabilized operational amplifier of claim 7 wherein said third control input signal functions to turn said fifth and sixth transistors simultaneously fully on and then partially on.

9. The chopper-stabilized operational amplifier of claim 1 wherein said sources of first and second bias voltages comprise an unbalanced differential amplifier.

10. The chopper-stabilized operational amplifier of claim 1 wherein said switch circuitry comprises a circuit for producing a signal representative of the absolute value of a difference between the values of a first and a second current.

11. The chopper-stabilized operational amplifier of claim 1 wherein said switch circuitry comprises an exclusive OR gate.

12. A chopper for stabilizing an operational amplifier, said chopper comprising an input chopper switch, and AC gain stage, an output chopper switch, and a clock, said AC gain stage for receiving an output from said input chopper switch and delivering an output to said output chopper switch, said clock for driving said input and output chopper switches, said input chopper switch comprising:

a first input terminal and a second input terminal for connection to inverting and non-inverting inputs, respectively, of an operational amplifier;

a bridge arrangement comprising a first high-side transistor connected in series with a first low-side transistor between said first and second input terminals and a second high-side transistor connected in series with a second low-side transistor between said first and second input terminals;

a first control input terminal coupled to respective control terminals of said first high-side transistor and said second low-side transistor;

a second control input terminal coupled to respective control terminals of said second high-side transistor and said second low-side transistor;

a control circuit comprising a source of a first bias voltage sufficient to turn said transistors fully on and a source of a second bias voltage sufficient to turn said transistors partially on and switch circuitry for delivering said first and second bias voltages in sequence to said first and said control inputs; and first and second output terminals coupled to common nodes between said high-side and low-side transistors, respectively.

13. The chopper of claim 12 wherein said input chopper switch further comprises a transitional capacitance element capable of absorbing charge carriers.

14. The chopper of claim 13 wherein said transitional capacitance element comprises a fifth transistor connected to said first input terminal and a sixth transistor connected to said second input terminal.

15. The chopper of claim 14 wherein said control circuit is for supplying a first control signal to said first control input terminal and a second control signal to said second input control terminal.

16. The chopper claim 15 wherein said input chopper switch further comprises a third control input terminal coupled to said fifth and sixth transistors.

17. A method of chopping an input signal for an operational amplifier comprising:

(a) passing said input signal through first and second variable resistors, said variable resistors being connected in series;

(b) adjusting said first variable resistor to a high impedance state and said second variable resistor to a low impedance state; and (c) adjusting said first variable resistor to a low impedance state and said second variable resistor to a high impedance state, wherein neither of said first and second variable resistors provides an open circuit when in said high impedance state.

18. The method of claim 17 wherein a significant current flows through said first and second variable resistors during (b) and (c).

19. The method of claim 17 comprising adjusting both of said first and second variable resistors to a high-impedance state between (b) and (c).

20. A method of chopping an input signal for an operational amplifier comprising:

(a) passing said input signal through first and second variable resistors, said variable resistors being connected in series;

(b) adjusting said first variable resistor to a high impedance state and said second variable resistor to a low impedance state;

(c) adjusting said first variable resistor to a low impedance state and said second variable resistor to a high impedance state;

(d) adjusting both of said first and second variable resistors to a high-impedance state between (b) and (c); and (e) supplying a transitional capacitance while both of said first and second variable resistors are in said high-impedance state.

* * * * *

UNITED STATES PATENT AND TRADEMARK OFFICE
CERTIFICATE OF CORRECTION

PATENT NO.   : 5,959,498
DATED        : September 28, 1999
INVENTOR(S)  : Sauer, Don R.

It is certified that error appears in the above-identified patent and that said Letters Patent is hereby corrected as shown below:

Title page,
ABSTRACT,
Line 8, delete "include:" and insert -- included --

Column 1,
Line 18, delete "an" and insert -- a --

Column 4,
Line 47, delete "71" and insert -- 73 --

Column 5,
Line 38, delete "transistors"

Column 6,
Line 1, delete "110" and insert -- 111 --
Line 2, delete "110" and insert -- 111 --

Signed and Sealed this

Twenty-sixth Day of March, 2002

*Attest:*

JAMES E. ROGAN
*Director of the United States Patent and Trademark Office*

*Attesting Officer*